US008609553B2

(12) United States Patent
Huang et al.

(10) Patent No.: US 8,609,553 B2
(45) Date of Patent: Dec. 17, 2013

(54) METHODS OF FORMING RUTILE TITANIUM DIOXIDE AND ASSOCIATED METHODS OF FORMING SEMICONDUCTOR STRUCTURES

(75) Inventors: Tsai-Yu Huang, Taipei County (TW); Vishwanath Bhat, Boise, ID (US); Vassil Antonov, Boise, ID (US); Chris Carlson, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 37 days.

(21) Appl. No.: 13/021,895

(22) Filed: Feb. 7, 2011

(65) Prior Publication Data
US 2012/0202356 A1    Aug. 9, 2012

(51) Int. Cl.
*H01L 21/31*    (2006.01)

(52) U.S. Cl.
USPC .................. 438/785; 423/611; 257/E21.24

(58) Field of Classification Search
USPC .................... 438/685, 785; 423/611
See application file for complete search history.

(56) References Cited

U.S. PATENT DOCUMENTS

| 4,200,474 | A | 4/1980 | Morris |
| 4,486,487 | A | 12/1984 | Skarp |
| 5,228,911 | A | 7/1993 | Kunii et al. |
| 6,156,606 | A | 12/2000 | Michaelis |
| 2006/0134433 | A1 | 6/2006 | Maula et al. |
| 2007/0024189 | A1 | 2/2007 | Yamamoto et al. |
| 2007/0054044 | A1 | 3/2007 | Shimosaki et al. |
| 2008/0087890 | A1* | 4/2008 | Ahn et al. ......................... 257/43 |
| 2008/0182408 | A1* | 7/2008 | Lee et al. ........................ 438/675 |
| 2009/0065896 | A1* | 3/2009 | Hwang ............................ 257/532 |
| 2009/0230510 | A1* | 9/2009 | Miki et al. ...................... 257/532 |
| 2009/0257170 | A1 | 10/2009 | Bhat et al. |
| 2009/0289327 | A1 | 11/2009 | Fujiwara |
| 2009/0311521 | A1 | 12/2009 | Nikolov et al. |
| 2010/0044771 | A1 | 2/2010 | Ahn et al. |
| 2010/0255652 | A1 | 10/2010 | Tanioku |

FOREIGN PATENT DOCUMENTS

| JP | 2247904 A | 10/1990 |
| JP | 2007110111 | 4/2007 |
| WO | 2005063629 A1 | 7/2005 |

OTHER PUBLICATIONS

Kim et al., Al-Doped TiO2 Films with Ultralow Leakage Currents for Next Generation DRAM Capacitors, Adv. Mater., 2008, vol. 20, pp. 1429-1435.

Lindgren, Torbjorn, et al., "Photoelectrochemical and Optical Properties of Nitrogen Doped Titanium Dioxide Films Prepared by Reactive DC Magnetron Sputtering," J. Phys. Chem. B 2003, 107, Jan. 28, 2003, pp. 5709-5716.

Liu, Hongyan, et al., "(Sulfur,Nitrogen)-Codoped Rutile-Titanium Dioxide as a Visible-Light-Activated Photocatalyst," J. Am. Ceram. Soc., 87[8], Mar. 8, 2004, pp. 1582-1584.

(Continued)

*Primary Examiner* — Alexander Ghyka
(74) *Attorney, Agent, or Firm* — TraskBritt

(57) ABSTRACT

Methods of forming rutile titanium dioxide. The method comprises exposing a transition metal (such as V, Cr, W, Mn, Ru, Os, Rh, Ir, Pt, Ge, Sn, or Pb) to oxygen gas ($O_2$) to oxidize the transition metal. Rutile titanium dioxide is formed over the oxidized transition metal. The rutile titanium dioxide is formed by atomic layer deposition by introducing a gaseous titanium halide precursor and water to the oxidized transition metal. Methods of forming semiconductor structures having rutile titanium dioxide are also disclosed.

8 Claims, 4 Drawing Sheets

(56) References Cited

OTHER PUBLICATIONS

International Search Report, International Application No. PCT/US2012/022766, mailed Sep. 25, 2012, three (3) pages.

Written Opinion of the International Searching Authority, International Application No. PCT/US2012/022766, mailed Sep. 25, 2012, four (4) pages.

* cited by examiner

METHODS OF FORMING RUTILE TITANIUM DIOXIDE AND ASSOCIATED METHODS OF FORMING SEMICONDUCTOR STRUCTURES

CROSS-REFERENCE TO RELATED APPLICATION

The present application is related to U.S. patent application Ser. No. 13/021,910, filed on Feb. 7, 2011, and titled "CAPACITORS INCLUDING A RUTILE TITANIUM DIOXIDE MATERIAL AND SEMICONDUCTOR DEVICES INCORPORATING SAME," now U.S. Pat. No. 8,564,095, issued Oct. 22, 2013, the disclosure of which is incorporated herein in its entirety by reference.

TECHNICAL FIELD

Embodiments of the present disclosure relate to semiconductor device fabrication and, more specifically, to methods of forming rutile titanium oxide on a semiconductor structure, and to methods of forming semiconductor device structures including the rutile titanium oxide.

BACKGROUND

As conventional semiconductor memory devices, such as Flash memory and dynamic random access memory (DRAM), reach their scaling limits, research has focused on commercially viable low power, low operation voltage, high-speed, and high-density non-volatile memory devices. Materials having high dielectric constants (i.e., high static relative permittivity) are needed to provide sufficient capacitance in ever-smaller production-scale capacitor designs. Because of its high dielectric constant (or "k" value), titanium dioxide ($TiO_2$) is being considered for use in non-volatile memory devices. $TiO_2$ has three main crystalline phases: rutile, anatase, and brookite. The phase of a $TiO_2$ crystal may depend on conditions of the $TiO_2$ growth process, such as temperature and method of deposition. Of significance in semiconductor manufacture is that the dielectric constant of $TiO_2$ varies based on properties such as crystalline phase, orientation, and deposition method. For example, $TiO_2$ films grown on silicon substrates by atomic layer deposition (ALD) generally have an anatase crystalline structure, which has a dielectric constant of about 30. The anatase $TiO_2$ may be converted to rutile $TiO_2$ through an annealing process, including heating the $TiO_2$ to a temperature above 800° C.

Rutile $TiO_2$ may exhibit higher dielectric constants than anatase $TiO_2$. For example, along the c-axis of the rutile $TiO_2$, the dielectric constant may be about 170, while the dielectric constant along the a-axis may be about 90. Dielectric constants above about 55 are needed to meet capacitance requirements of DRAM in size ranges currently produced. As the scale of devices decreases, anatase $TiO_2$ is not generally useful because its dielectric constant is too low.

A high deposition or anneal temperature is generally required to form rutile $TiO_2$. For example, a semiconductor structure having anatase $TiO_2$ thereon may be annealed by heating the anatase $TiO_2$ to a temperature of about 800° C. During the anneal, the $TiO_2$ crystalline structure may change from anatase to rutile. However, heating the anatase $TiO_2$ to a temperature of about 800° C. may damage other structures on or within the semiconductor structure. For example, metal interconnects on or in the semiconductor structure may melt under such conditions. Rutile $TiO_2$ may also be formed directly (i.e., without annealing anatase $TiO_2$) by deposition at high temperature. Because of the processing temperatures needed to form rutile $TiO_2$, use of rutile $TiO_2$ may be limited to semiconductor structures that can tolerate high temperatures. DRAM and other structures may not withstand such temperatures. To take advantage of the high dielectric constants of rutile $TiO_2$ on semiconductor structure that cannot tolerate high temperatures, it would be desirable to have a method of forming rutile $TiO_2$ without using high temperatures required to deposit $TiO_2$ in the rutile phase and without annealing anatase $TiO_2$.

Japanese patent publication JP-A 2007-110111 describes a method of forming rutile $TiO_2$ on a ruthenium electrode using a process temperature of less than 500° C. In that method, a ruthenium(IV) oxide pretreatment film is formed by exposing a ruthenium electrode to gaseous ozone ($O_3$). Rutile $TiO_2$ is then deposited in a film over the ruthenium(IV) oxide film, and a second electrode is formed over both films.

DETAILED DESCRIPTION

The following description provides specific details, such as material types and processing conditions, in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional semiconductor fabrication techniques employed in the industry. In addition, the description provided below does not form a complete process flow for manufacturing a semiconductor device, i.e., the semiconductor device structures described below do not form a complete semiconductor device. Only those process acts and structures necessary to understand the embodiments of the present disclosure are described in detail below. Additional acts to form a complete semiconductor device from the semiconductor device structures may be performed by conventional semiconductor fabrication techniques, which are not described in detail herein.

Methods of forming rutile titanium dioxide ($TiO_2$) and methods of forming semiconductor device structures having rutile $TiO_2$ are disclosed. In particular, the methods may be used to form a desired thickness of rutile $TiO_2$. Rutile $TiO_2$ has a tetragonal crystal structure with a coordination number of six. Each titanium cation is surrounded by an octahedron of six oxygen atoms. The methods may include oxidizing a transition metal to form a transition metal oxide, then forming rutile $TiO_2$ over the transition metal oxide. The rutile $TiO_2$ may be formed by ALD. The transition metal oxide may be formed, for example, over a substrate. The rutile $TiO_2$ may be formed at thicknesses of from about 30 Å to about 200 Å, and may be formed from two or more precursors. For example, the rutile $TiO_2$ may be formed by ALD using a titanium halide precursor and water, such as water vapor.

Figure 1A:
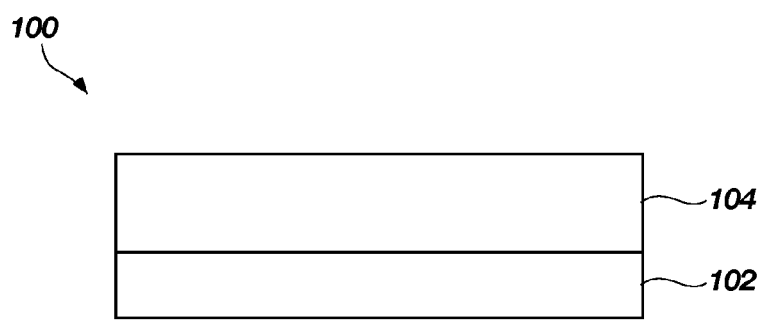
FIGS. 1A through 1C are schematics illustrating methods of forming rutile $TiO_2$ and semiconductor structures in accordance with embodiments of the present disclosure.

FIG. 1A shows a semiconductor structure 100 including a substrate 102 over which metal 104 has been formed. The substrate 102 may be a conventional silicon substrate or other bulk substrate having a layer of semiconductor material. As used herein, the term "bulk substrate" includes not only silicon wafers, but also silicon-on-insulator (SOI) substrates, silicon-on-sapphire (SOS) substrates, epitaxial layers of silicon on a base semiconductor foundation, and other semiconductor or optoelectronics materials, such as silicon-germanium, germanium, gallium arsenide, or indium phosphide. The substrate 102 may be in the form of semiconductor wafers, wafer fragments, or assemblies of such wafers or fragments. Substrate 102 may have other materials or features (not shown) formed upon or within the substrate 102 (e.g., electrodes, lines, vias, traces, sources, and drains). Such features may be formed by conventional semiconductor fabrication techniques, which are not described in detail herein. By way of example, the substrate 102 may be formed from silicon, polysilicon, titanium nitride, an oxide, or a metal. The metal 104 may be formed on the substrate 102 by chemical vapor deposition (CVD), ALD, physical vapor deposition (PVD), or any other deposition method known in the art. The metal 104 may be formed at a thickness of from about 15 Å to about 100 Å, such as from about 30 Å to about 80 Å. The metal 104 may be any metal in which an oxide of the metal is configured to form a crystal structure similar to the crystal structure of rutile $TiO_2$. The metal 104 may be a transition metal, such as vanadium (V), chromium (Cr), tungsten (W), manganese (Mn), ruthenium (Ru), osmium (Os), rhodium (Rh), iridium (Ir), platinum (Pt), germanium (Ge), tin (Sn), or lead (Pb). In one embodiment, the metal 104 is Ru. Though not shown in FIG. 1A, an adhesion material may, optionally, be formed on the substrate 102 to promote adhesion of the metal 104 to the substrate 102. Adhesion materials are known in the art and, therefore, are not described in detail herein.

Figure 1B:
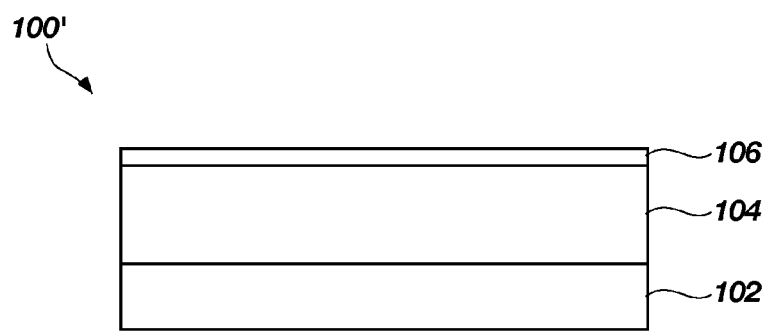

The metal 104 may be oxidized with an oxidant, for example, by exposing the semiconductor structure 100 to the oxidant. A portion of the metal 104 may react with the oxidant to form the metal oxide 106, shown on semiconductor structure 100' in FIG. 1B. The oxidant may be an oxidizer that is of sufficient strength to react with the metal 104 to form a metal oxide 106. However, the strength of the oxidizer may not be such as to substantially remove (i.e., etch) the metal 104.

The oxidant may be, for example, oxygen ($O_2$), nitric oxide (NO), nitrous oxide ($N_2O$), etc. The oxidant may be substantially pure (i.e., greater than about 95% pure, such as greater than about 99% pure or greater than about 99.9% pure), or may be mixed with an inert gas (e.g., argon, nitrogen). During the oxidation, absolute pressure within a chamber (not shown) in which the oxidation is conducted may be maintained at a pressure from about 13 Pa (about 0.1 Torr) to about 101.3 kPa (about 760 Torr). During the oxidation, the semiconductor structure 100 may be heated to a temperature of, for example, from about 150° C. to about 450° C., such as from about 200° C. to about 400° C., or from about 250° C. to about 350° C. The semiconductor structure 100 may be heated in the presence of the oxidant for a time period of from about 30 seconds to about 60 minutes, such as a time period of from about 5 minutes to about 20 minutes.

During the oxidation, strong oxidants, such as ozone ($O_3$), may be avoided, because the strong oxidant may remove at least a portion of the metal 104. For example, if ruthenium is used as the metal 104, the ruthenium may react with ozone to form $RuO_4$, which is volatile. The volatile $RuO_4$ may vaporize, leaving little or no ruthenium on the semiconductor structure 100'. Since the metal 104 may have a thickness of less than about 100 Å, removing even a portion of metal 104 may make the metal 104 too thin for effective formation of metal oxide 106 and subsequent formation of the rutile $TiO_2$ thereon.

The metal oxide 106 formed on the metal 104 may have a thickness of from about 5 Å to about 10 Å. In one embodiment, the metal oxide 106 is about 7 Å thick. The metal oxide 106 may be a material having a crystalline structure similar to the crystalline structure of rutile $TiO_2$, for example, $VO_2$, $CrO_2$, $WO_2$, $MnO_2$, $RuO_2$, $OsO_2$, $RhO_2$, $IrO_2$, $PtO_2$, $GeO_2$, $SnO_2$, or $PbO_2$. In one embodiment, the metal oxide 106 is ruthenium(IV) oxide ($RuO_2$).

Figure 1C:
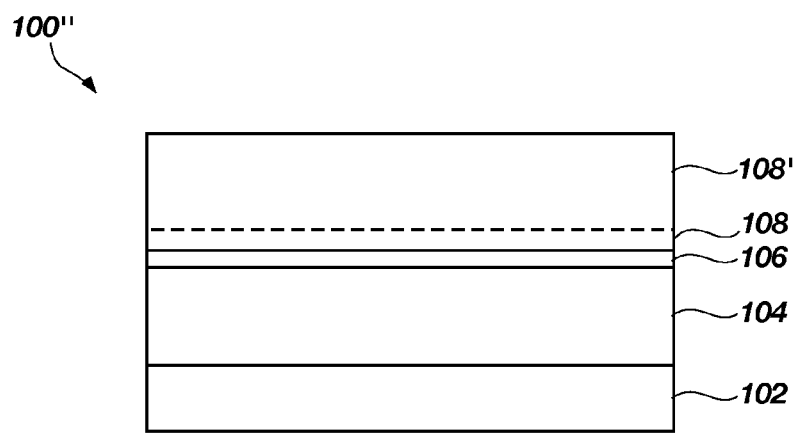

Referring now to semiconductor structure 100" shown in FIG. 1C, rutile $TiO_2$ 108 may be formed over the metal oxide 106. The rutile $TiO_2$ 108 may be formed by an ALD process that includes sequentially exposing the semiconductor structure 100' to gaseous precursors suitable for use as ALD precursors. The ALD precursors may include a titanium halide ($TiX_4$) precursor, where "X" is a halide, such as fluorine (F), chlorine (Cl), bromine (Br), or iodine (I), and water ($H_2O$), such as water vapor. The titanium halide precursor may be, for example, titanium tetrafluoride ($TiF_4$), titanium tetrachloride ($TiCl_4$), titanium tetrabromide ($TiBr_4$), or titanium tetraiodide ($TiI_4$). The rutile $TiO_2$ 108 may be formed by sequentially exposing the semiconductor structure 100' to each ALD precursor in a chamber (not shown), such as an ALD chamber. Chambers for use in ALD processes are known in the art and, therefore, details of such are not described herein. The chamber may be maintained at a temperature, for example, of from about 150° C. to about 600° C., such as a temperature from about 150° C. to about 450° C. Though formation at a higher temperature may also produce rutile $TiO_2$, the surface of rutile $TiO_2$ formed at a higher temperature may be too rough for use in some applications. Furthermore, some semiconductor structures 100' may not tolerate exposure to a higher temperature. The rutile $TiO_2$ 108 may be formed to a selected thickness, such as from about 5 Å to about 200 Å. By forming the rutile $TiO_2$ 108 by ALD, the thickness of the rutile $TiO_2$ 108 may depend on the number of titanium and oxygen monolayers deposited. That is, the rutile $TiO_2$ 108 of a selected thickness may be achieved by selecting an appropriate number of ALD cycles.

The crystalline structure of the metal oxide 106 may enable the $TiO_2$ to form in the rutile phase at a lower temperature than those temperatures conventionally utilized for the formation of rutile $TiO_2$. For example, anatase $TiO_2$ is, conventionally, heated to a temperature above 800° C. to form rutile $TiO_2$. However, in the methods according to embodiments of the present disclosure, the formation of rutile $TiO_2$ 108 over the metal oxide 106 may be achieved at a substantially lower temperature (e.g., a temperature of less than about 600° C.). Without being bound by a particular theory, it is believed that crystalline molecular sites on a surface of the metal oxide 106 may guide titanium atoms into positions that correspond with the positions of titanium atoms in a rutile $TiO_2$ crystalline structure. With the initial titanium atoms in place for a rutile crystalline structure, the oxygen atoms may arrange in appropriate positions to continue growth of the rutile crystalline structure. In other words, the metal oxide 106 may act as a template for forming the rutile $TiO_2$ 108. Therefore, metal oxides 106 having a crystalline structure similar to rutile $TiO_2$ may be better suited to forming rutile $TiO_2$ 108 thereupon than metal oxides 106 with less-similar crystal structures. The rutile $TiO_2$ 108 may be formed to a desired thickness, such as to a thickness of from about 30 Å to about 200 Å, by repeating the ALD process until a desired number of ALD cycles has been conducted.

Once an initial portion of the rutile $TiO_2$ has been formed as described above, an additional portion of rutile $TiO_2$ 108' may, optionally, be formed over the rutile $TiO_2$ 108 as indicated by the dashed line in FIG. 1C. This rutile $TiO_2$ 108' may be formed by ALD as described above and may be formed in the same chamber or in a different chamber. Alternatively, after the rutile $TiO_2$ 108 has been formed by the ALD process using $TiX_4$ and $H_2O$ as ALD precursors, rutile $TiO_2$ 108' may be formed using a $TiX_4$ precursor and a different oxygen-containing precursor, such as an oxygen-containing precursor having an increased oxidizing strength compared to $H_2O$. For example, ozone ($O_3$) may be used as the oxygen-containing precursor. The oxygen-containing precursor, which has increased oxidizing strength compared to $H_2O$, may not be suitable as an ALD precursor for forming the rutile $TiO_2$ 108 directly on the metal oxide 106 because the oxygen-containing precursor may damage or remove (e.g., etch) the metal oxide 106. But, if the metal oxide 106 is protected by rutile $TiO_2$ 108 (e.g., a rutile $TiO_2$ 108 having a thickness of at least about 5 Å), the oxygen-containing precursor may not react with the metal oxide 106. For example, without the protection provided by rutile $TiO_2$ 108, exposure of ruthenium or ruthenium(IV) oxide to ozone may produce ruthenium tetraoxide ($RuO_4$), which is a volatile compound. In this situation, the $RuO_4$ (metal oxide 104) may vaporize, leaving no rutile crystalline structure appropriate for forming rutile $TiO_2$ 108 thereon. But, once an initial portion of rutile $TiO_2$ 108 has been formed over the metal oxide 106, the possibility of further oxidation (and, therefore, loss) of metal oxide 106 may diminish. The rutile $TiO_2$ 108' may be formed at any selected thickness, such as from about 30 Å to about 200 Å. Rutile $TiO_2$ 108' of a selected thickness may be formed by selecting an appropriate number of ALD cycles. After formation of the rutile $TiO_2$ 108', the rutile $TiO_2$ 108' may be indistinguishable from rutile $TiO_2$ 108 (i.e., there may be no detectable difference or interface between rutile $TiO_2$ 108 and rutile $TiO_2$ 108').

The rutile $TiO_2$ 108 formed by the methods according to embodiments of the present disclosure may be used as an insulator in a capacitor, such as a metal-insulator-metal capacitor of a DRAM memory device or a NAND memory device. Additional fabrication acts for forming the metal-insulator-metal capacitor and the DRAM or NAND memory device are known in the art and, therefore, details of such are not provided herein.

Figure 2A:
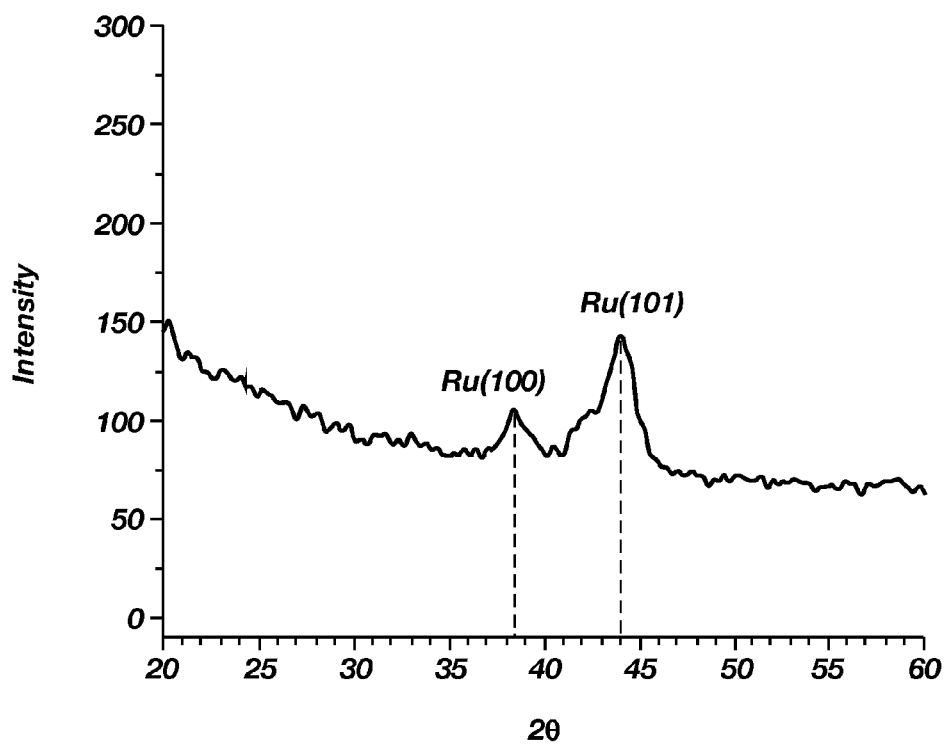
FIGS. 2A through 2D include X-ray diffraction (XRD) results showing the XRD response of semiconductor structures formed in accordance with embodiments of the present disclosure.

The formation of rutile $TiO_2$ by methods according to embodiments of the present disclosure was confirmed by X-ray diffraction (XRD) of a semiconductor structure similar to semiconductor structure 100". FIG. 2A shows the results of the XRD analysis on a semiconductor structure 100' similar to that shown in FIG. 1B. The semiconductor structure 100' included a silicon substrate 102, ruthenium as metal 104, and ruthenium oxide as metal oxide 106. The semiconductor structure 100' was formed by applying Ru to the silicon substrate by a CVD process. The Ru was oxidized at a temperature of 250° C. for 10 minutes in a mixture of 30% $O_2$ and 70% Ar, at a chamber pressure of 133 Pa (1.0 Ton), producing $RuO_2$ on the Ru. The semiconductor structure 100' was then analyzed by grazing incidence X-ray diffraction (GI-XRD). FIG. 2A shows peaks at measured angles (2θ) of about 38.5° and 44°, which correspond to known ruthenium responses.

Figure 2B:
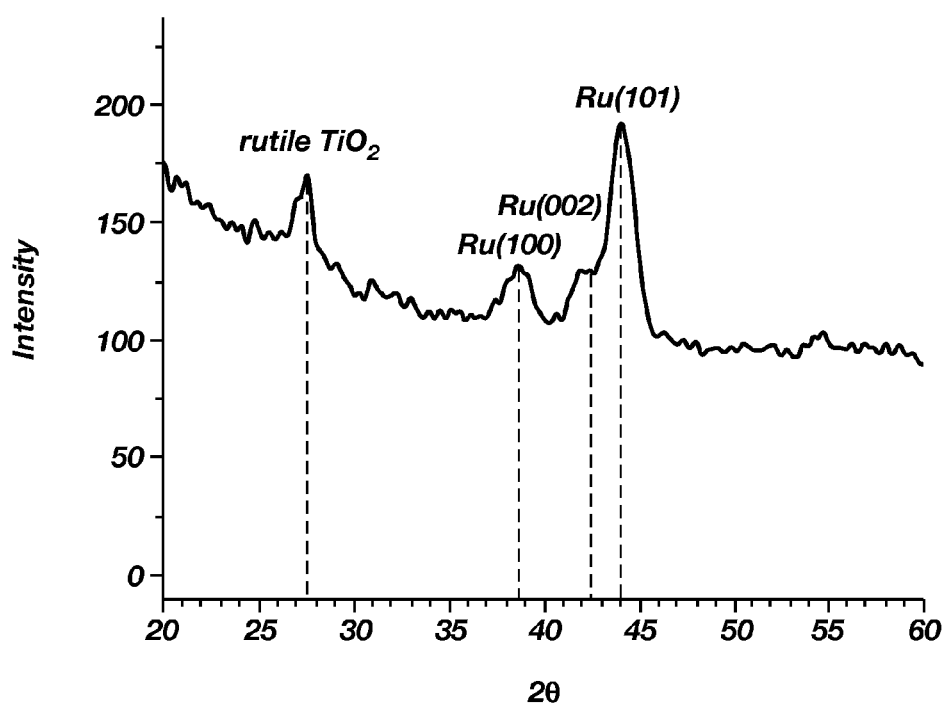

FIG. 2B shows the XRD results of a semiconductor structure similar to the semiconductor structure 100" shown in FIG. 1C. Rutile $TiO_2$ was formed by ALD on the semiconductor structure 100' tested in FIG. 2A using $TiCl_4$ and $H_2O$ as ALD precursors, forming semiconductor structure 100". The semiconductor structure 100' was exposed to each precursor 220 times, in series, at 400° C. The semiconductor structure 100" was then subjected to XRD analysis. The graph in FIG. 2B shows peaks at measured angles (2θ) of about 27.5°, 38.5°, 42.5°, and 44°. The peaks at 38.5°, 42.5°, and 44° correspond to known ruthenium responses. The peak at 27.5° corresponds to a known rutile $TiO_2$ response, and its presence indicates that rutile $TiO_2$ was formed over the $RuO_2$.

Figure 2C:
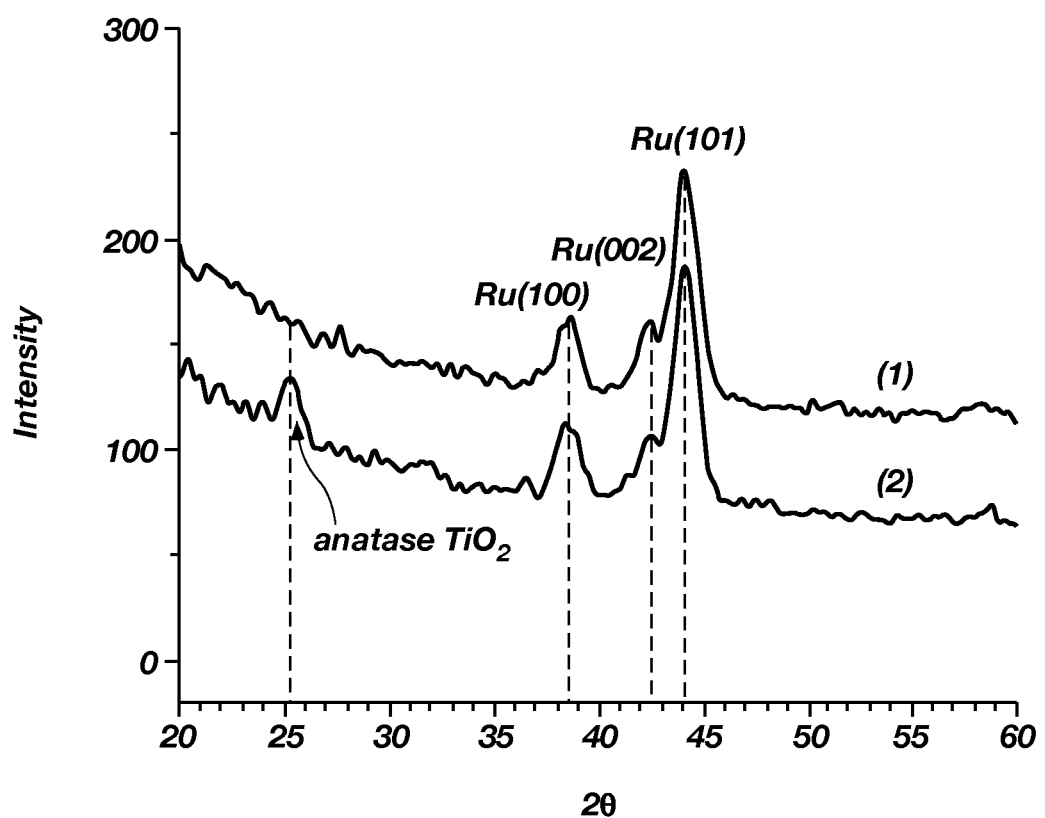
Figure 2D:
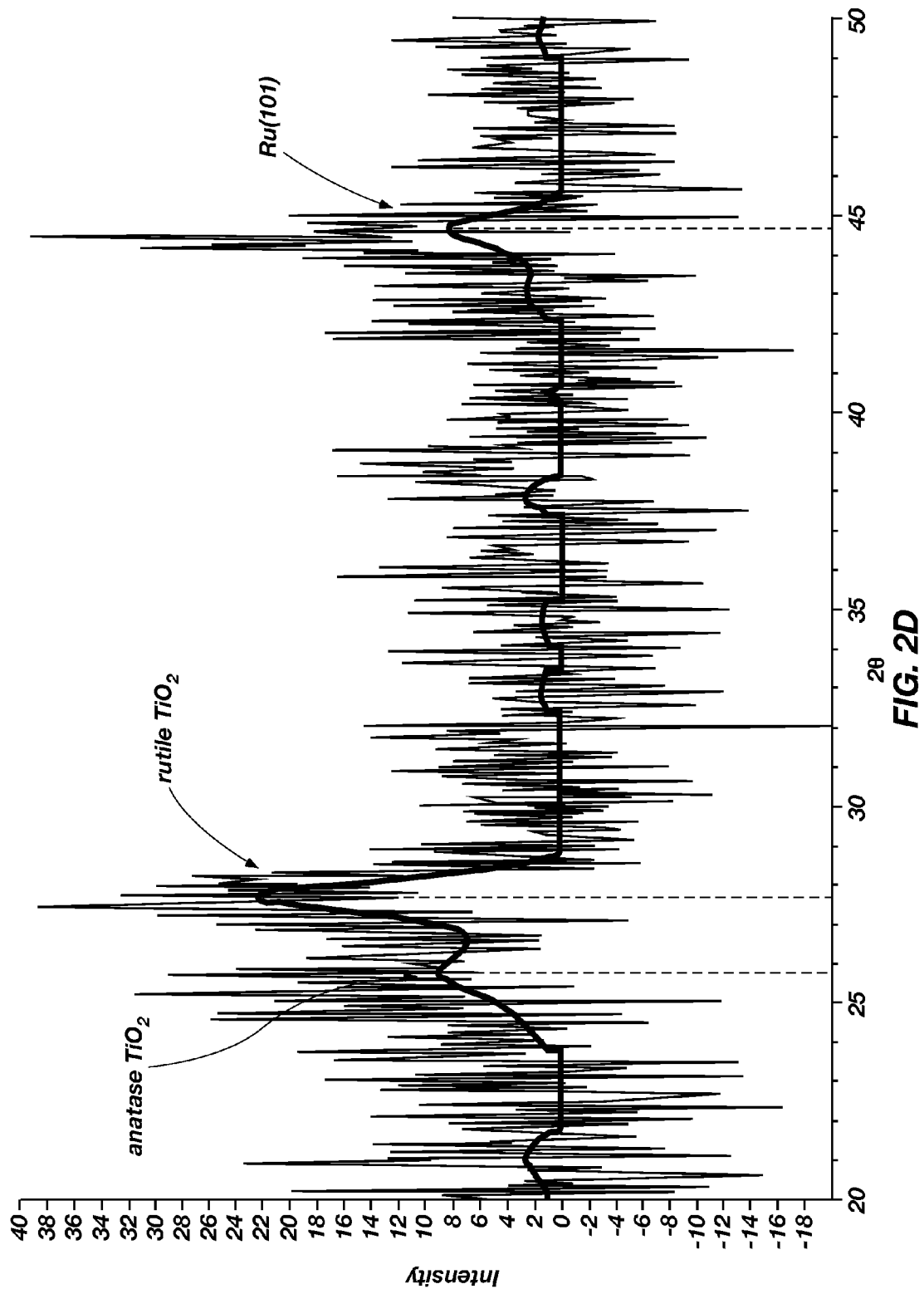

For comparison, FIGS. 2C and 2D show XRD results of semiconductor structures similar to the semiconductor structure 100" except that the $TiO_2$ was formed using non-halide titanium precursors (i.e., titanium oxide precursors). FIG. 2C shows the XRD results of a semiconductor structure formed by ALD $TiO_2$ deposition using $CH_3C_5H_4Ti[N(CH_3)_2]_3$ (TIMCTA) as the titanium precursor. Two semiconductor structures were tested having Ru and $RuO_2$ applied as described with respect to FIGS. 2A and 2B. Curve 1 in FIG. 2C shows the intensity of diffracted X-rays on a semiconductor structure having 100 Å thick $TiO_2$ formed by ALD using TIMCTA and $H_2O$ as the ALD precursors. As shown in FIG. 2C, rutile $TiO_2$ was not formed on the substrate (i.e., the 27.5° rutile peak, as seen in FIG. 2B, was not observed). The response curve showed only the Ru peaks at 38.5°, 42.5°, and 44°. Absence of the rutile peak indicates that rutile $TiO_2$ was not present in significant amount on the substrate aligned under these conditions.

Curve 2 in FIG. 2C shows the intensity of diffracted X-rays on a semiconductor structure having $TiO_2$ formed with two sets of ALD precursors. The semiconductor structure included Ru and $RuO_2$ as described above. A 30 Å layer of $TiO_2$ was formed using TIMCTA and $H_2O$ as the ALD precursors, and a 70 Å layer of $TiO_2$ was formed over the 30 Å layer using TIMCTA and $O_3$ as the ALD precursors. XRD analysis of this semiconductor structure produced the peaks for Ru, plus a peak near 25°, indicating that anatase phase $TiO_2$ was formed on the semiconductor structure (see curve 2). The 27.5° rutile peak (as shown in FIG. 2B) was not observed, indicating that rutile $TiO_2$ was not present in a significant amount on the semiconductor structure formed under these conditions.

FIG. 2D shows the XRD results for a semiconductor structure formed by ALD $TiO_2$ deposition using titanium tetraisopropoxide ($Ti(OC_3H_7)_4$ or TTIP) and $H_2O$ as the ALD precursors. The semiconductor structure included Ru and $RuO_2$ as described above, and the $TiO_2$ was formed thereover. The XRD analysis showed a ruthenium peak at about 44.5°, plus peaks at about 25.5° for anatase $TiO_2$, and at about 27.5° for rutile $TiO_2$. The presence of both anatase and rutile $TiO_2$ peaks suggests that formation of ALD $TiO_2$ with TTIP did not produce a uniform rutile $TiO_2$ phase under these conditions.

CONCLUSION

In one embodiment, the present disclosure includes a method of forming rutile titanium dioxide. The method comprises exposing a transition metal to oxygen gas ($O_2$) to produce an oxidized transition metal and forming rutile titanium dioxide over the oxidized transition metal.

In another embodiment, the present disclosure includes a method of forming rutile titanium dioxide. The method comprises oxidizing a portion of a ruthenium material to ruthenium(IV) oxide, introducing a gaseous titanium halide precursor and water vapor to the ruthenium(IV) oxide, and forming rutile titanium dioxide on the ruthenium(IV) oxide.

In yet another embodiment, the present disclosure includes a method of forming a semiconductor structure that comprises forming ruthenium on a substrate, exposing the ruthenium to oxygen gas ($O_2$) to oxidize a portion of the ruthenium to ruthenium(IV) oxide, and exposing the ruthenium(IV) oxide to titanium tetrachloride and water to form rutile titanium dioxide on the ruthenium(IV) oxide.

While the invention is susceptible to various modifications and alternative forms, specific embodiments have been shown, by way of example, in the drawings and have been described in detail herein. However, the invention is not intended to be limited to the particular forms disclosed. Rather, the invention is to cover all modifications, equivalents, and alternatives falling within the scope of the invention as defined by the following appended claims and their legal equivalents.

What is claimed is:

1. A method of forming a semiconductor structure, comprising:
    forming ruthenium on a substrate;
    exposing the ruthenium to oxygen gas ($O_2$) to oxidize a portion of the ruthenium to form ruthenium(IV) oxide overlying a remaining portion of the ruthenium without etching the ruthenium; and
    exposing the ruthenium(IV) oxide to titanium tetrachloride and water to form rutile titanium dioxide on the ruthenium(IV) oxide by atomic layer deposition.

2. The method of claim 1, wherein exposing the ruthenium to $O_2$ to oxidize a portion of the ruthenium to form ruthenium(IV) oxide comprises forming ruthenium(IV) oxide having a thickness of from about 5 Å to about 10 Å.

3. The method of claim 1, wherein exposing the ruthenium to $O_2$ to oxidize a portion of the ruthenium to form ruthenium(IV) oxide comprises exposing the ruthenium to the $O_2$ at a temperature of from about 200° C. to about 400° C.

4. The method of claim 1, wherein exposing the ruthenium(IV) oxide to titanium tetrachloride and water to form rutile titanium dioxide on the ruthenium(IV) oxide comprises exposing the ruthenium(IV) oxide to titanium tetrachloride and water while maintaining the substrate at a temperature below about 450° C.

5. The method of claim 1, further comprising exposing the rutile titanium dioxide to titanium tetrachloride and ozone.

6. The method of claim 1, wherein exposing the ruthenium to $O_2$ to oxidize a portion of the ruthenium to form ruthenium(IV) oxide comprises exposing ruthenium having a thickness of from about 15 Å to about 100 Å to the $O_2$.

7. The method of claim 1, further comprising forming additional rutile titanium dioxide on the rutile titanium dioxide by sequentially exposing the rutile titanium dioxide to a titanium halide precursor and another oxidizer.

8. The method of claim 7, wherein sequentially exposing the rutile titanium dioxide to a titanium halide precursor and another oxidizer comprises exposing the rutile titanium dioxide to the titanium halide precursor and ozone.

* * * * *